(12) United States Patent
Chen et al.

(10) Patent No.: US 9,142,798 B2
(45) Date of Patent: Sep. 22, 2015

(54) PACKAGE OF ENVIRONMENTAL SENSITIVE ELECTRONIC ELEMENT

(75) Inventors: Kuang-Jung Chen, Hsinchu County (TW); Jian-Lin Wu, Yunlin County (TW); Shu-Tang Yeh, Taichung (TW)

(73) Assignee: Industrial Technology Research Institute, Hsinchu (TW)

(*) Notice: Subject to any disclaimer, the term of this patent is extended or adjusted under 35 U.S.C. 154(b) by 0 days.

(21) Appl. No.: 13/354,298

(22) Filed: Jan. 19, 2012

(65) Prior Publication Data

US 2013/0126932 A1 May 23, 2013

(30) Foreign Application Priority Data

Nov. 21, 2011 (TW) .............................. 100142470 A

(51) Int. Cl.
*H01L 33/56* (2010.01)
*H01L 51/52* (2006.01)

(52) U.S. Cl.
CPC .................................. *H01L 51/5256* (2013.01)

(58) Field of Classification Search
CPC ................... H01L 51/5237; H01L 2251/5338; H01L 51/5246; H01L 2251/5315; H01L 51/5256
USPC ..................... 257/642, 99, E23.007, E25.008, 257/E51.018, E51.001, E51.022, E51.024, 257/E51.027, E51.026

See application file for complete search history.

(56) References Cited

U.S. PATENT DOCUMENTS

| | | |
|---|---|---|
| 5,091,223 A | 2/1992 | Mori et al. |
| 5,855,994 A | 1/1999 | Biebuyck et al. |
| 5,920,020 A | 7/1999 | Korupp |
| 6,226,890 B1 | 5/2001 | Boroson et al. |
| 6,465,593 B2 | 10/2002 | LeBoeuf |
| 6,624,568 B2 | 9/2003 | Silvernail |

(Continued)

FOREIGN PATENT DOCUMENTS

| | | |
|---|---|---|
| CN | 101945965 | 1/2011 |
| CN | 102097595 | 6/2011 |

(Continued)

OTHER PUBLICATIONS

Song et al., "New hybrid encapsulation for flexible organic light-emitting devices on plastic substrates," Chinese Science Bulletin, vol. 53, No. 6, Mar. 2008, p. 958-960.

(Continued)

*Primary Examiner* — Jaehwan Oh
(74) *Attorney, Agent, or Firm* — Jianq Chyun IP Office

(57) ABSTRACT

A package of an environmental sensitive electronic element including a first substrate, a second substrate, an environmental sensitive electronic element, a flexible structure layer and a filler layer is provided. The environmental sensitive electronic element is disposed on the first substrate and located between the first substrate and the second substrate. The environmental sensitive electronic element includes an anode layer, a hole injecting layer, a hole transporting layer, an organic light emitting layer, a cathode layer and an electron injection layer. The flexible structure layer is disposed on the environmental sensitive electronic element and includes a soft layer, a trapping layer and a protective layer. The material of the trapping layer is the same as the material of the electron injection layer. The filler layer is disposed between the first substrate and the second substrate and encapsulates the environmental sensitive electronic element and the flexible structure layer.

23 Claims, 3 Drawing Sheets

(56) References Cited

U.S. PATENT DOCUMENTS

| | | | |
|---|---|---|---|
| 6,740,145 | B2 | 5/2004 | Boroson et al. |
| 6,835,950 | B2 | 12/2004 | Brown et al. |
| 6,873,102 | B2 | 3/2005 | Martelli et al. |
| 6,897,474 | B2 | 5/2005 | Brown et al. |
| 6,998,648 | B2 | 2/2006 | Silvernail |
| 7,211,881 | B2 | 5/2007 | McKinnell et al. |
| 7,224,116 | B2 | 5/2007 | Stegamat |
| 7,268,486 | B2 | 9/2007 | Ottermann et al. |
| 7,364,925 | B2 * | 4/2008 | Lee et al. ............ 438/21 |
| 8,149,498 | B2 * | 4/2012 | Hsieh et al. .......... 359/296 |
| 2004/0031977 | A1 * | 2/2004 | Brown et al. ......... 257/222 |
| 2004/0081852 | A1 | 4/2004 | Chen et al. |
| 2004/0197944 | A1 | 10/2004 | Chen et al. |
| 2005/0179379 | A1 | 8/2005 | Kim |
| 2005/0238808 | A1 | 10/2005 | Gatineau et al. |
| 2006/0006798 | A1 | 1/2006 | Buckley |
| 2006/0060086 | A1 * | 3/2006 | Wang et al. .......... 96/108 |
| 2006/0072308 | A1 | 4/2006 | Booty, Jr. |
| 2006/0076632 | A1 | 4/2006 | Palmateer et al. |
| 2006/0076634 | A1 | 4/2006 | Palmateer et al. |
| 2006/0087230 | A1 * | 4/2006 | Ghosh et al. ......... 313/512 |
| 2007/0049155 | A1 | 3/2007 | Moro et al. |
| 2007/0241674 | A1 | 10/2007 | Chao et al. |
| 2007/0295941 | A1 * | 12/2007 | Kahn et al. .......... 252/500 |
| 2008/0012477 | A1 | 1/2008 | Koo et al. |
| 2008/0213579 | A1 * | 9/2008 | Lee et al. ............ 428/339 |
| 2010/0123152 | A1 * | 5/2010 | Sugisawa et al. ...... 257/98 |
| 2011/0140164 | A1 | 6/2011 | Seo et al. |
| 2011/0171764 | A1 | 7/2011 | Toonen et al. |
| 2013/0038206 | A1 * | 2/2013 | Aurongzeb .......... 313/512 |

FOREIGN PATENT DOCUMENTS

| | | |
|---|---|---|
| TW | I262036 | 9/2006 |
| TW | 200905940 | 2/2009 |
| TW | 201110281 | 3/2011 |

OTHER PUBLICATIONS

Williams et al., "Flat-plate encapsulation solution for OLED displays using a printed getter," Journal of the SID 15/2, 2007, p. 103-112.

Lee et al., "Effect of transparent film desiccant on the lifetime of top-emitting active matrix organic light emitting diodes," American Institute of Physics, 2007, p. 103518-1-103518-3.

Huang et al., "Lifetime Improvement of Organic Light Emitting Diodes using LiF Thin Film and UV Glue Encapsulation," Japanese Journal of Applied Physics, vol. 47, No. 8, 2008, p. 5676-5680.

Jian et al., "Effect of Desiccant on the Performance of Green Organic Light-Emitting Device," Optical Review, vol. 18, No. 1, 2011, p. 34-38.

T. Robert Harris, "Review of Organic Light Emitting Diode Fabrication and Recent Progress," ECE-592-S Soft Electronics Final Paper, May 4, 2008, p. 1-6.

"Office Action of Taiwan Counterpart Application", issued on Jul. 15, 2014, p. 1-p. 7.

"Office Action of China Counterpart Application", issued on Jan. 5, 2015, p. 1-10.

* cited by examiner

PACKAGE OF ENVIRONMENTAL SENSITIVE ELECTRONIC ELEMENT

CROSS-REFERENCE TO RELATED APPLICATION

This application claims the priority benefit of Taiwan application serial no. 100142470, filed on Nov. 21, 2011. The entirety of the above-mentioned patent application is hereby incorporated by reference herein and made a part of this specification.

BACKGROUND

1. Technical Field

The disclosure relates to a package and a method for packing the same, and more particularly to a package of an environmental sensitive electronic element and a method for packing the same.

2. Related Art

Compared with a common rigid substrate, a flexible substrate is more widely used, and has the advantages of being flexible, convenient for carry and satisfactory for safety, and wide product application, and the disadvantages of poor thermal resistance, poor moisture and oxygen barrier property, poor chemical tolerance, and high thermal expansion coefficient. For a typical flexible substrate, because the penetration of moisture and oxygen cannot be prevented completely, the aging of an electronic element on the substrate is accelerated, causing that a fabricated element has a shortened service life, and thus does not meet the demands in commerce. In addition, due to the flexibility of the flexible substrate, when the flexible substrate is warped, the electronic element fabricated on the substrate is easily subjected to delaminating, thereby causing that the electronic element cannot be operated normally.

In the prior art, for example, in U.S. Pat. No. 6,624,568 and US Patent Publication Document US 2007/0049155, a polymer is used as a package material of an organic electroluminescence element, with which although a good moisture and oxygen barrier property can be obtained, the problem of delaminating encountered by the organic electroluminescence element is not considered in the prior art. Therefore, how to alleviate the delaminating occurred when the organic electroluminescence element is warped has become one of the problems needed to be solved in massive production of the conventional organic electroluminescence element.

SUMMARY

A package of an environmental sensitive electronic element is introduced herein, which has a good flexibility.

The disclosure provides a package of an environmental sensitive electronic element, which includes a first substrate, a second substrate, an environmental sensitive electronic element, a flexible structure layer and a filler layer. The second substrate is configured above the first substrate. The environmental sensitive electronic element is configured on the first substrate, and located between the first substrate and the second substrate. The environmental sensitive electronic element includes an anode layer, a hole injecting layer, a hole transporting layer, an organic light emitting layer, a cathode layer and an electron injection layer. The anode layer is configured on the first substrate. The hole injecting layer is configured on the anode layer. The hole transporting layer is configured on the hole injecting layer. The organic light emitting layer is configured on the hole transporting layer. The cathode layer is configured on the organic light emitting layer. The electron injection layer is configured between the organic light emitting layer and the cathode layer. The flexible structure layer is configured on the environmental sensitive electronic element, and includes a soft layer, a trapping layer and a protective layer. The soft layer is configured on the cathode layer. The trapping layer is configured on the soft layer. The material of the trapping layer is the same as the material of the electron injection layer. The protective layer is configured on the soft layer. The filler layer is configured between the first substrate and the second substrate, and encapsulates the environmental sensitive electronic element and the flexible structure layer.

The disclosure further provides a package of an environmental sensitive electronic element, which includes a first substrate, a second substrate, an environmental sensitive electronic element, a flexible structure layer and a filler layer. The second substrate is configured above the first substrate. The environmental sensitive electronic element is configured on the first substrate, and located between the first substrate and the second substrate. The environmental sensitive electronic element includes an anode layer, a hole injecting layer, a hole transporting layer, an organic light emitting layer, a cathode layer and an electron injection layer. The anode layer is configured on the first substrate. The hole injecting layer is configured on the anode layer. The hole transporting layer is configured on the hole injecting layer. The organic light emitting layer is configured on the hole transporting layer. The cathode layer is configured on the organic light emitting layer. The electron injection layer is configured between the organic light emitting layer and the cathode layer. The flexible structure layer is configured on the environmental sensitive electronic element, and includes a soft layer, a trapping layer and a protective layer. The soft layer is configured on the cathode layer. The trapping layer is configured on the soft layer. The material of the trapping layer is the same as the material of the cathode layer. The protective layer is configured on the soft layer. The filler layer is configured between the first substrate and the second substrate, and encapsulates the environmental sensitive electronic element and the flexible structure layer.

The disclosure further provides a package of an environmental sensitive electronic element, which includes a first substrate, a second substrate, an environmental sensitive electronic element, a flexible structure layer and a filler layer. The second substrate is configured above the first substrate. The environmental sensitive electronic element is configured on the first substrate, and located between the first substrate and the second substrate. The environmental sensitive electronic element includes an anode layer, an organic functional layer, and a cathode layer. The anode layer is configured on the first substrate. The organic functional layer is configured on the anode layer. The cathode layer is configured on the organic functional layer. The flexible structure layer is configured on the environmental sensitive electronic element, and includes a soft layer, a trapping layer, and a protective layer. The soft layer is configured on the cathode layer. The trapping layer is configured on the soft layer. The material of the trapping layer is the same as the material of the organic functional layer or the cathode layer. The protective layer is configured on the soft layer. The filler layer is configured between the first substrate and the second substrate, and encapsulates the environmental sensitive electronic element and the flexible structure layer.

Therefore, when the package of the environmental sensitive electronic element is unduly warped, the delaminating occurs to the flexible structure layer. Based on the above, through the fabrication of the flexible structure layer on the environmental sensitive electronic element in the disclosure, the delaminating occurred when the environmental sensitive electronic element is warped can be alleviated, thereby improving the yield of the product.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
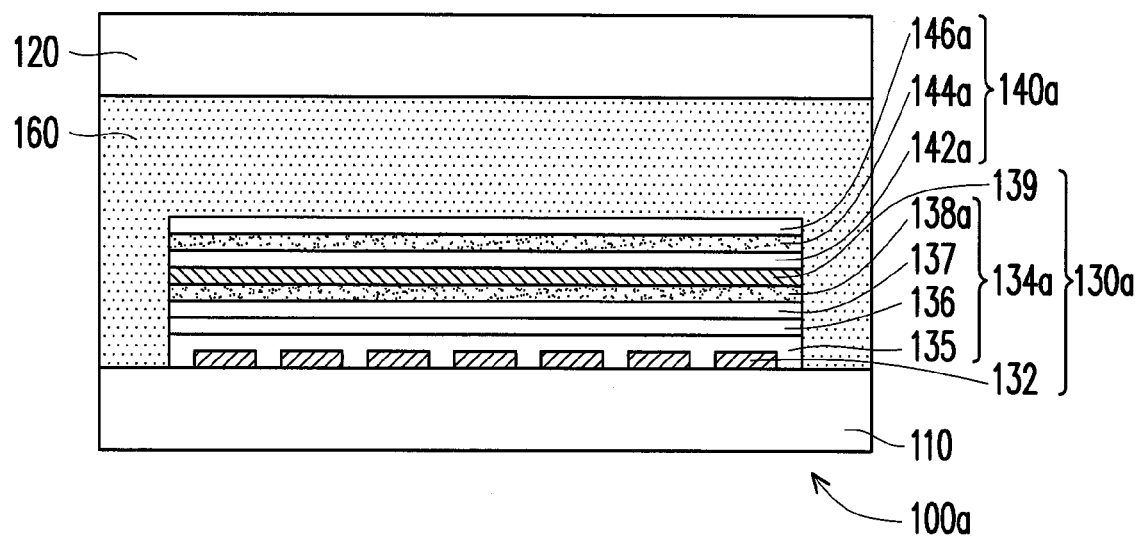
FIG. 1 is a schematic cross-sectional diagram illustrating a package of an environmental sensitive electronic element according to an exemplary embodiment of the disclosure.

FIG. 1 is a schematic cross-sectional diagram illustrating a package of an environmental sensitive electronic element according to an exemplary embodiment of the disclosure. Referring to FIG. 1, a package of an environmental sensitive electronic element 100a in this embodiment comprises a first substrate 110, a second substrate 120, an environmental sensitive electronic element 130a, a flexible structure layer 140a, and a filler layer 160. The first substrate 110 is configured in parallel to the second substrate 120, and the second substrate 120 is configured above the first substrate 110. In this embodiment, the first substrate 110 and the second substrate 120 are respectively, for example, a flexible substrate, made from, for example, a plastic, such as plastics of PE series, PMMA, PC (Polycarbonate) or PI (Polyimide). For example, the plastics of PE series are flexible plastics such as PEC, PEN, and PES. Definitely, the material of the flexible substrate may also be, but is not limited to, a metal film.

The environmental sensitive electronic element 130a is configured on the first substrate 110, and located between the first substrate 110 and the second substrate 120. The environmental sensitive electronic element 130a includes an anode layer 132, an organic functional layer 134a and a cathode layer 139, where the anode layer 132 is configured on the first substrate 110, the organic functional layer 134a is configured on the anode layer 132, and the cathode layer 139 is configured on the organic functional layer 134a. More specifically, the organic functional layer 134a has a multi-layer laminated structure formed by a hole injecting layer 135, a hole transporting layer 136, an organic light emitting layer 137, and an electron injection layer 138a. The hole injecting layer 135 is configured on and covers the anode layer 132, and the hole transporting layer 136 is configured on the hole injecting layer 135. The organic light emitting layer 137 is configured on the hole transporting layer 136, the cathode layer 139 is configured on the organic light emitting layer 137, and the electron injection layer 138a is configured between the organic light emitting layer 137 and the cathode layer 139. Herein, the hole injecting layer 135, the hole transporting layer 136, the organic light emitting layer 137, the electron injection layer 138a, and the cathode layer 139 are disposed to have the same shape.

The flexible structure layer 140a is configured on the environmental sensitive electronic element 130a, and is disposed to have the same shape as the environmental sensitive electronic element 130a, in which the flexible structure layer 140a includes a soft layer 142a, a trapping layer 144a, and a protective layer 146a. The soft layer 142a is configured on the cathode layer 139, and directly covers the cathode layer 139, and the trapping layer 144a and the protective layer 146a are configured on the soft layer 142a. More specifically, the trapping layer 144a of the flexible structure layer 140a in this embodiment is located between the protective layer 146a and the soft layer 142a. Particularly, the material of the trapping layer 144a of the flexible structure layer 140a is the same as the material of the electron injection layer 138a of the environmental sensitive electronic element 130a. In addition, the filler layer 160 in this embodiment is configured between the first substrate 110 and the second substrate 120, and the filler layer 160 encapsulates the environmental sensitive electronic element 130a and the flexible structure layer 140a. Herein, the material of the filler layer 160 is, for example, acrylic resin or epoxy resin, and the configuration of the filler layer 160 is, for example, but not limited to, a pressure sensitive adhesive or a filler adhesive.

Furthermore, in this embodiment, the material of the trapping layer 144a of the flexible structure layer 140a may have an electrical conductivity and a moisture barrier property, and may be, for example, an alkali metal/alkaline-earth metal halide, an alkali metal/alkaline-earth metal oxide, an alkali metal/alkaline-earth metal carbonate, or an alkali metal acetate. In particular, the alkali metal/alkaline-earth metal halide is, for example, lithium fluoride (LiF), sodium fluoride (NaF), cesium fluoride (CsF), magnesium fluoride ($MgF_2$), calcium fluoride ($CaF_2$), sodium chloride (NaCl), potassium chloride (KCl), rubidium chloride (RbCl), magnesium chloride ($MgCl_2$), or calcium chloride ($CaCl_2$). The alkali metal/alkaline-earth metal oxide is, for example, lithium oxide ($Li_2O$), cesium oxide ($Cs_2O$), magnesium oxide (MgO), calcium oxide (CaO), lithium metaborate ($LiBO_2$), or potassium silicon oxide ($K_2SiO_3$). The alkali metal/alkaline-earth metal carbonate is, for example, lithium carbonate ($Li_2CO_3$), sodium carbonate ($Na_2CO_3$), or cesium carbonate ($Cs_2CO_3$). The alkali metal acetate is, for example, lithium acetate ($CH_3COOLi$), sodium acetate ($CH_3COONa$), potassium acetate ($CH_3COOK$), rubidium acetate ($CH_3COORb$), or cesium acetate ($CH_3COOCs$).

Moreover, the material of the soft layer 142a of the flexible structure layer 140a in this embodiment is, for example, an organic small molecular material, an organic oligomer, a mixture of an oligomer with an inorganic material, or a mixture of organic small molecules with an inorganic material. The molecular weight of the organic small molecular compound ranges from about 10 g/mol to 5,000 g/mol, for example, Alq3 Tris-(8-hydroxyquinoline)aluminum, alpha-NPB N,N'-Bis (naphthalene-1-yl)-N,N'-diphenyl-benzidine, or CuPc Phthalocyanine, a copper complex. The molecular weight of the organic oligomer ranges from about 500 g/mol to 9,000 g/mol, for example, phenylene vinylene oligomers, or fluorene oligomers. The molecular weight of an organic-inorganic co-evaporated material ranges from about 3 g/mol to 500 g/mol.

In addition, the material of the protective layer 146a of the flexible structure layer 140a is, for example, a metal material or an inorganic material. The metal material is, for example, Al, Ag, Au, Be, Cr, Cu, Co, Fe, Ge, Ir, In, Mo, Mn, Mg, Ni, Nb, Pb, Pd, Pt, Ru, Rh, Sn, Si, Sb, Se, Ti, Ta, Te, V, W, Zr, Zn, Mg/Ag, Al/Ag, Al/Si, Al/Si/Cu, Au/Ge, Au/Be, Au/Ge/Ni, Ni/Cr, Pb/Sn, or In/Sn. The inorganic material is, for example, ITO, IZO, AZO, $WO_3$, $MoO_3$, SiOx, SiNx, SiOxNy, $Al_2O_3$, AlN, $BaTiO_3$, $CeO_2$, $Cr_2O_3$, CuO, $Dy_2O_3$, $Er_2O_3$, $EU_2O_3$, $Ga_2O_3$, $GeO_2$, $HfO_2$, $Ho_2O_3$, $In_2O_3$, ITO, $PbTiO_3$, MgO, $MnO_2$, $Nd_2O_3$, NiO, $Nb_2O_5$, $Pr_2O_3$, $Sm_2O_3$, $SiO_2$, SiO, $Ta_2O_5$, $ThO_2$, $SnO_2$, $TiO_3$, $Y_2O_3$, ZnO, $ZrO_2$, CdTe, ZnTe, CdSe, CdS, ZnS, or $MoS_2$.

Because the flexible structure layer 140a in this embodiment is configured on the environmental sensitive electronic element 130a, and the soft layer 142a of the flexible structure layer 140a directly covers the cathode layer 139 of the environmental sensitive electronic element 130a, when the package of the environmental sensitive electronic element 100a is warped, the delaminating unlikely occurs between the structural layers of the environmental sensitive electronic element 130a (including the anode layer 132, the organic functional layer 134a, and the cathode layer 139), but easily occurs to an interface between the soft layer 142a and the cathode layer 139, or to an interface between the soft layer 142a and the trapping layer 144a. That is to say, the flexible structure layer 140a is designed such that the delaminating occurred between the structural layers of the environmental sensitive electronic element 130a can be effectively alleviated when the package of the environmental sensitive electronic element 100a is warped.

Moreover, because the material of the trapping layer 144a of the flexible structure layer 140a in this embodiment is the same as the material of the electron injection layer 138a of the environmental sensitive electronic element 130a, a fabrication process of the flexible structure layer 140a may be combined with that of the environmental sensitive electronic element 130a. In other words, the flexible structure layer 140a and the environmental sensitive electronic element 130a may be fabricated in the same chamber, without modifying an existing process significantly, through which the acquisition of the raw materials can be effectively controlled and the cost for purchasing the equipment can be lowered. In addition, because the filler layer 160 encapsulates the environmental sensitive electronic element 130a and the flexible structure layer 140a, and the material of the trapping layer 144a of the flexible structure layer 140a has the electrical conductivity and the moisture barrier property, the moisture and oxygen barrier capability of the package of the environmental sensitive electronic element 100a can be increased, and the service life of the environmental sensitive electronic element 130a can be effectively prolonged.

It should be noted that element numerals and part of the content in the foregoing embodiment are continuously adopted in embodiments below, in which the same numerals are used to represent the same or similar elements, and the descriptions for the same technical contents are omitted. The descriptions for the omitted parts may be made reference to those in the foregoing embodiment, and are not further repeated herein again.

Figure 2:
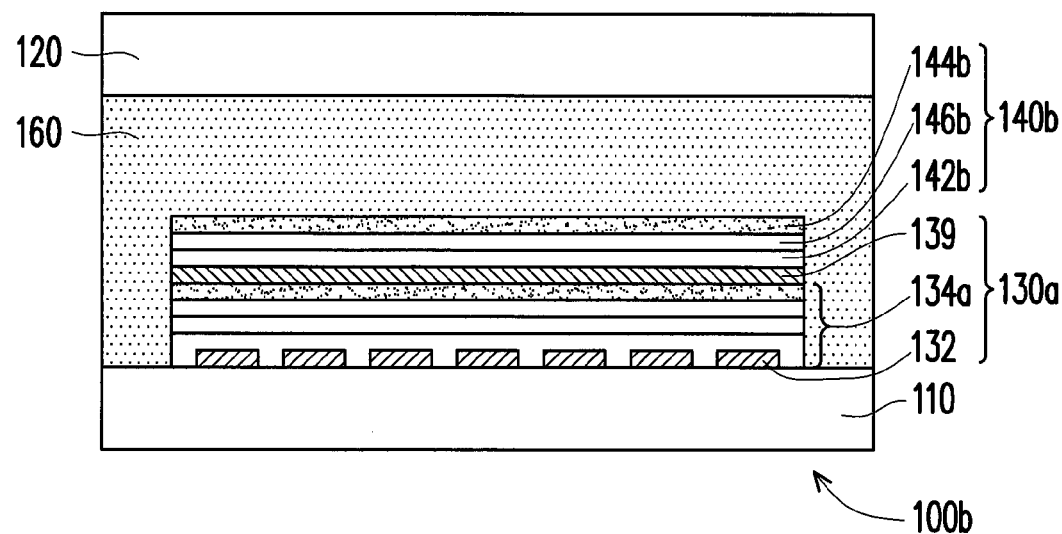
FIG. 2 is a schematic cross-sectional diagram illustrating a package of an environmental sensitive electronic element according to another exemplary embodiment of the disclosure.

FIG. 2 is a schematic cross-sectional diagram illustrating a package of an environmental sensitive electronic element according to another exemplary embodiment of the disclosure. Referring to FIG. 2, a package of an environmental sensitive electronic element 100b in this embodiment is similar to the package of the environmental sensitive electronic element 100a shown in FIG. 1, except for the main difference that a flexible structure layer 140b in the package of the environmental sensitive electronic element 100b has a different film lamination manner. In particular, a protective layer 146b of the flexible structure layer 140b in this embodiment is located between a trapping layer 144b and a soft layer 142b. Therefore, when the package of the environmental sensitive electronic element 100b is warped, the delaminating easily occurs to an interface between the soft layer 142b and the cathode layer 139 or to an interface between the soft layer 142b and the protective layer 146b. That is to say, the flexible structure layer 140b is designed such that the delaminating occurred between the structural layers of the environmental sensitive electronic element 130a can be effectively alleviated when the package of the environmental sensitive electronic element 100b is warped.

Figure 3:
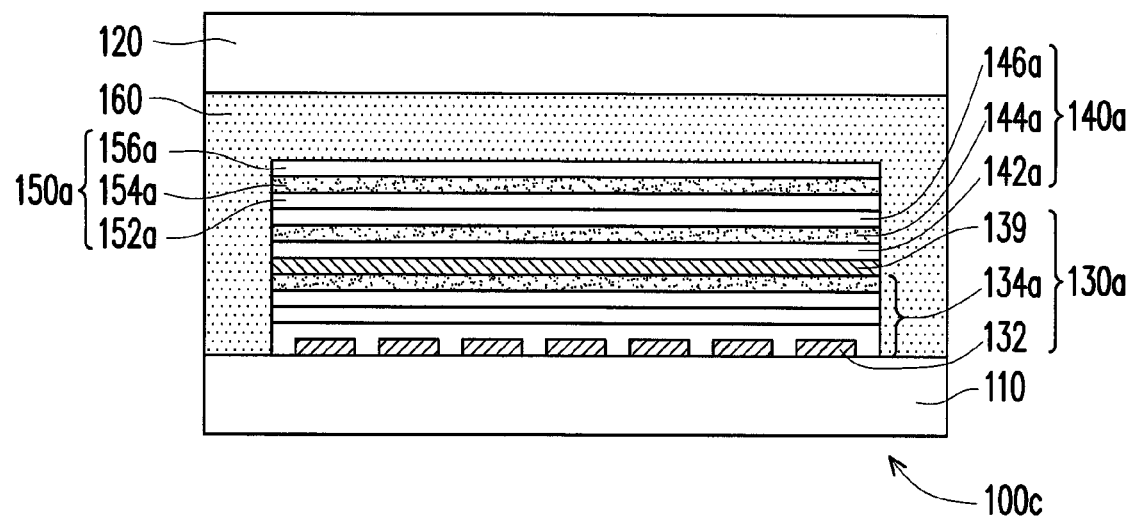
FIG. 3 is a schematic cross-sectional diagram illustrating a package of an environmental sensitive electronic element according to another exemplary embodiment of the disclosure.

FIG. 3 is a schematic cross-sectional diagram illustrating a package of an environmental sensitive electronic element according to another exemplary embodiment of the disclosure. Referring to FIG. 3, a package of an environmental sensitive electronic element 100c in this embodiment is similar to the package of the environmental sensitive electronic element 100a shown in FIG. 1, except for the main difference that the package of the environmental sensitive electronic element 100c further includes an auxiliary flexible structure layer 150a, in which the auxiliary flexible structure layer 150a is configured on the flexible structure layer 140a and located between the second substrate 120 and the flexible structure layer 140a. The auxiliary flexible structure layer 150a directly covers the flexible structure layer 140a. In particular, the auxiliary flexible structure layer 150a includes an auxiliary soft layer 152a, an auxiliary trapping layer 154a and an auxiliary protective layer 156a, in which the auxiliary soft layer 152a covers the protective layer 146a, and the auxiliary trapping layer 154a is located between the auxiliary protective layer 156a and the auxiliary soft layer 152a.

Because the multi-layer laminated flexible structure layer 140a and the auxiliary flexible structure layer 150a are disposed on the environmental sensitive electronic element 130a, the delaminating easily occurs to an interface between the soft layer 142a of the flexible structure layer 140a and the cathode layer 139 of the environmental sensitive electronic element 130a, to an interface between the auxiliary soft layer 152a of the auxiliary flexible structure layer 150a and the protective layer 146a of the flexible structure layer 140a, or to an interface between the auxiliary soft layer 152a and the auxiliary trapping layer 154a, when the package of the environmental sensitive electronic element 100c is warped. As such, the delaminating occurred when the conventional environmental sensitive electronic element 130a is warped can be effectively alleviated, thereby improving the product yield of the package of the environmental sensitive electronic element 100c.

In addition, exemplarily, the material of the auxiliary soft layer 152a is, for example, the same as the material of the soft layer 142a, the material of the auxiliary trapping layer 154a is, for example, the same as the material of the trapping layer 144a, and the material of the auxiliary protective layer 156a is the same as the material of the protective layer 146a. In this case, a fabrication process of the auxiliary flexible structure layer 150a may be combined with that of the flexible structure layer 140a and the environmental sensitive electronic element 130a. That is to say, the auxiliary flexible structure layer 150a, the flexible structure layer 140a, and the environmental sensitive electronic element 130a may be fabricated in the same chamber, without modifying an existing process significantly, through which the acquisition of the raw materials can be effectively controlled and the cost for purchasing the equipment can be lowered.

Figure 4:
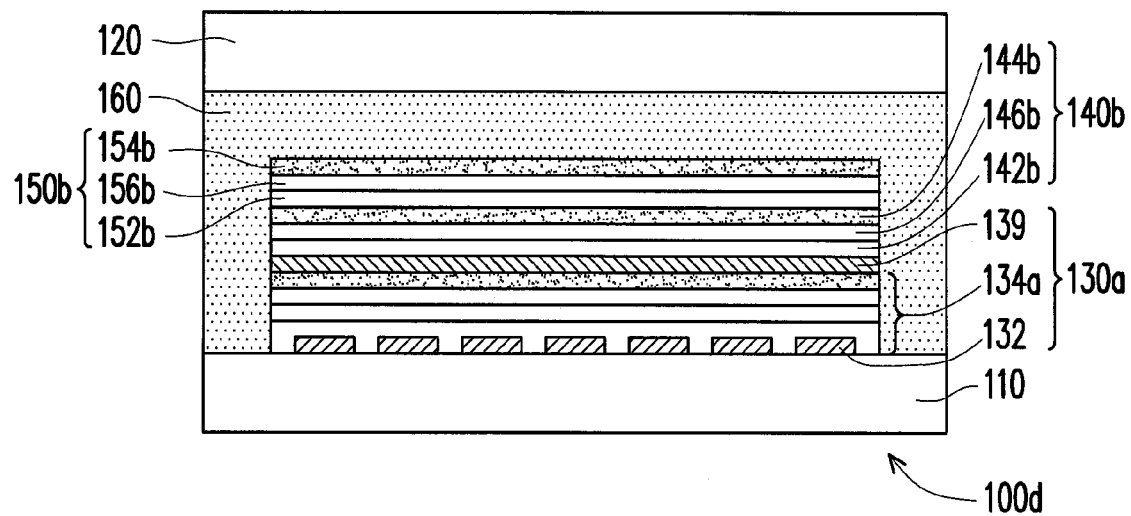
FIG. 4 is a schematic cross-sectional diagram illustrating a package of an environmental sensitive electronic element according to another exemplary embodiment of the disclosure.

FIG. 4 is a schematic cross-sectional diagram illustrating a package of an environmental sensitive electronic element according to another exemplary embodiment of the disclosure. Referring to FIG. 4, a package of an environmental sensitive electronic element 100d in this embodiment is similar to the package of the environmental sensitive electronic element 100b shown in FIG. 2, except for the main difference that the package of the environmental sensitive electronic element 100d further includes at least one auxiliary flexible structure layer 150b, in which the auxiliary flexible structure layer 150b is configured on the flexible structure layer 140b and located between the second substrate 120 and the flexible structure layer 140b. The auxiliary flexible structure layer 150b directly covers the flexible structure layer 140b. In particular, the auxiliary flexible structure layer 150b includes an auxiliary soft layer 152b, an auxiliary trapping layer 154b, and an auxiliary protective layer 156b, in which the auxiliary soft layer 152b covers the trapping layer 144b, and the auxiliary protective layer 156b is located between the auxiliary trapping layer 154b and the auxiliary soft layer 152b.

Because the multi-layer laminated flexible structure layer 140b and the auxiliary flexible structure layer 150b are disposed on the environmental sensitive electronic element 130a, the delaminating easily occurs to an interface between the soft layer 142b of the flexible structure layer 140b and the cathode layer 139 of the environmental sensitive electronic element 130a, to an interface between the soft layer 142b and the protective layer 146b, to an interface between the auxiliary soft layer 152b of the auxiliary flexible structure layer 150b and the trapping layer 144b of the flexible structure layer 140b, or to an interface between the auxiliary soft layer 152b and the auxiliary protective layer 156b when the package of the environmental sensitive electronic element 100d is warped. As such, the delaminating occurred when the conventional environmental sensitive electronic element 130a is warped can be effectively alleviated, thereby improving the product yield of the package of the environmental sensitive electronic element 100d.

In addition, exemplarily, the material of the auxiliary soft layer 152b is, for example, the same as the material of the soft layer 142b, the material of the auxiliary trapping layer 154b is, for example, the same as the material of the trapping layer 144b, and the material of the auxiliary protective layer 156b is the same as the material of the protective layer 146b. In this case, a fabrication process of the auxiliary flexible structure layer 150b may be combined with that of the flexible structure layer 140b and the environmental sensitive electronic element 130a. That is to say, the auxiliary flexible structure layer 150b, the flexible structure layer 140b, and the environmental sensitive electronic element 130a may be fabricated in the same chamber, without modifying an existing process significantly, through which the acquisition of the raw materials can be effectively controlled and the cost for purchasing the equipment can be lowered.

It should be noted that in this embodiment, the number of the auxiliary flexible structure layers 150a and 150b is not limited, although the number of the auxiliary flexible structure layers 150a and 150b configured respectively on the flexible structure layer 140a and 140b is specifically one. However, in other embodiments that are not shown, persons of skill in the art can increase the number of the auxiliary flexible structure layers 150a and 150b with reference to the descriptions in the foregoing embodiments according to practical demands, to achieve a desired technical effect.

Figure 5:
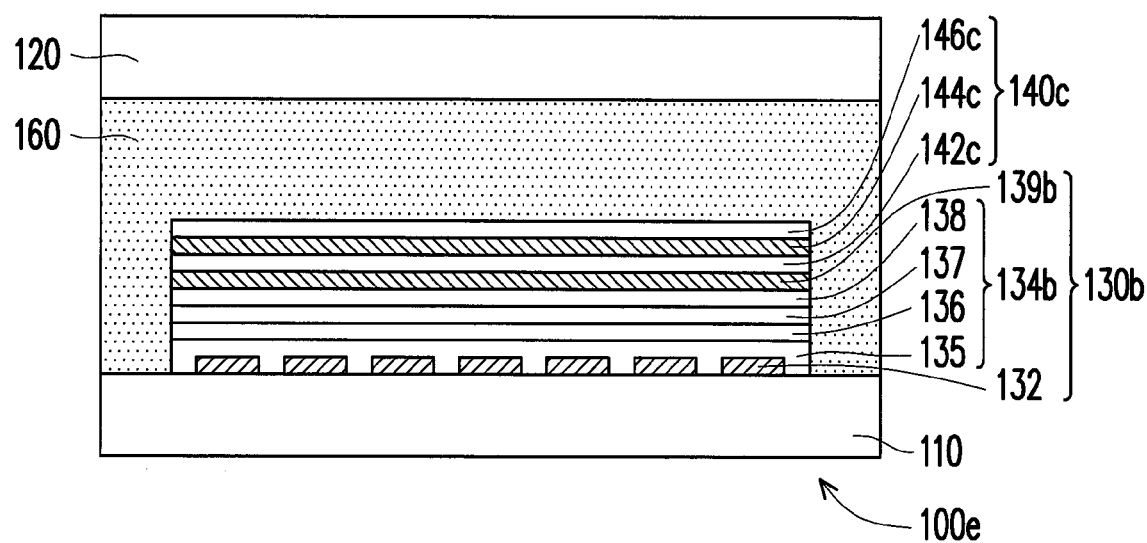
FIG. 5 is a schematic cross-sectional diagram illustrating a package of an environmental sensitive electronic element according to another exemplary embodiment of the disclosure.

FIG. 5 is a schematic cross-sectional diagram illustrating a package of an environmental sensitive electronic element according to another exemplary embodiment of the disclosure. Referring to FIG. 5, a package of an environmental sensitive electronic element 100e in this embodiment is similar to the package of the environmental sensitive electronic element 100a shown in FIG. 1, except for the material properties of a trapping layer 144c of a flexible structure layer 140c. In particular, in this embodiment, the material of the trapping layer 144c of the flexible structure layer 140c is essentially the same as the material of a cathode layer 139b located on an electron injection layer 138 of an organic functional layer 134b. The trapping layer 144c is located between a soft layer 142c and a protective layer 146c. More specifically, the material of the trapping layer 144c has an electrical conductivity and an oxygen barrier property, and may be selected from the group consisting of silver (Ag), aluminium (Al), magnesium (Mg), lithium (Li), indium (In), calcium (Ca), copper (Cu), molybdenum (Mo), titanium (Ti), platinum (Pt), iridium (Ir), nickel (Ni), chromium (Cr), aurum (Au), and a combination thereof.

Because the flexible structure layer 140c in this embodiment is configured on an environmental sensitive electronic element 130b, and a soft layer 142c of the flexible structure layer 140c directly covers the cathode layer 139b of the environmental sensitive electronic element 130b, when the package of the environmental sensitive electronic element 100e is warped, the delaminating unlikely occurs between the structural layers (including the anode layer 132, the organic functional layer 134b, and the cathode layer 139b) of the environmental sensitive electronic element 130b, but easily occurs to an interface between the soft layer 142c and the cathode layer 139b or to an interface between the soft layer 142c and the trapping layer 144c. That is to say, the flexible structure layer 140c is designed such that the delaminating occurred between the structural layers of the environmental sensitive electronic element 130b when the package of the environmental sensitive electronic element 100e is warped can be effectively alleviated.

Moreover, because the material of the trapping layer 144c of the flexible structure layer 140c in this embodiment is the same as the material of the cathode layer 139b of the environmental sensitive electronic element 130b, a fabrication process of the flexible structure layer 140c may be combined with that of the environmental sensitive electronic element 130b. In other words, the flexible structure layer 140c and the environmental sensitive electronic element 130b may be fabricated in the same chamber, without modifying an existing process significantly, through which the acquisition of the raw materials can be effectively controlled and the cost for purchasing the equipment can be lowered. In addition, because the filler layer 160 encapsulates the environmental sensitive electronic element 130b and the flexible structure layer 140c, and the material of the flexible structure layer 140c also has the electrical conductivity and the oxygen barrier property, the moisture and oxygen barrier capability of the package of the environmental sensitive electronic element 100e can be increased, and the service life of the environmental sensitive electronic element 130b can be effectively prolonged.

In addition, in other embodiments that are not shown, the auxiliary flexible structures 150a and 150b mentioned in the foregoing embodiments may also be used. The members may be used by persons skilled in the art with reference to the descriptions in the foregoing embodiments according to practical demands, to achieve a desired technical effect. In addition, in other embodiments, the flexible structure layer 140c may also have a different film lamination manner, that is, the protective layer 146c is located between the soft layer 142c and the trapping layer 144c. This lamination manner is still a technical solution useful in the disclosure, and does not depart from the protection scope of the disclosure.

In summary, because different configurations of flexible structure layer are fabricated on the environmental sensitive electronic element in this disclosure, the delaminating occurs in the flexible structure layer when the package of the environmental sensitive electronic element is unduly warped, so that the delaminating occurred when the environmental sensitive electronic element is warped can be alleviated, and thus a light emitting structure (that is, the organic functional layer) is not destroyed when the environmental sensitive electronic element is warped.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A package of an environmental sensitive electronic element, comprising:
    a first substrate;
    a second substrate, configured above the first substrate;
    an environmental sensitive electronic element, configured on the first substrate, located between the first substrate and the second substrate, wherein the environmental sensitive electronic element has a first top surface, a first bottom surface opposite to the first top surface and connecting to the first substrate and a first vertical sidewall connecting and perpendicular to the first top surface and the first bottom surface, and the environmental sensitive electronic element comprising:
    an anode layer, configured on the first substrate;
    a hole injecting layer, configured on the anode layer;
    a hole transporting layer, configured on the hole injecting layer;
    an organic light emitting layer, configured on the hole transporting layer;
    a cathode layer, configured on the organic light emitting layer; and
    an electron injection layer, configured between the organic light emitting layer and the cathode layer;
    a flexible structure layer, configured on the environmental sensitive electronic element, wherein the flexible structure layer has a second top surface, a second bottom surface opposite to the second top surface and connecting to the first top surface of the environmental sensitive electronic element and a second vertical sidewall connecting and perpendicular to the second top surface and the second bottom surface, and the flexible structure layer comprising:
    a soft layer, configured on the cathode layer;
    a trapping layer, configured on the soft layer, wherein the material of the trapping layer is the same as the material of the electron injection layer; and
    a protective layer, configured on the soft layer; and
    a filler layer, configured between the first substrate and the second substrate, and at least covering the first vertical sidewall of the environmental sensitive electronic element and the second vertical sidewall and the second top surface of the flexible structure layer, and when the package of the environmental sensitive electronic element is warped, a delaminating occurs to the flexible structure layer.

2. The package of an environmental sensitive electronic element according to claim 1, wherein the trapping layer of the flexible structure layer is located between the protective layer and the soft layer.

3. The package of an environmental sensitive electronic element according to claim 2, further comprising at least one auxiliary flexible structure layer, configured on the flexible structure layer and located between the second substrate and the flexible structure layer, wherein the auxiliary flexible structure layer comprises an auxiliary soft layer, an auxiliary trapping layer, and an auxiliary protective layer, wherein the auxiliary soft layer covers the protective layer, and the auxiliary trapping layer is located between the auxiliary protective layer and the auxiliary soft layer.

4. The package of an environmental sensitive electronic element according to claim 1, wherein the protective layer of the flexible structure layer is located between the trapping layer and the soft layer.

5. The package of an environmental sensitive electronic element according to claim 4, further comprising at least one auxiliary flexible structure layer, configured on the flexible structure layer and located between the second substrate and the flexible structure layer, wherein the auxiliary flexible structure layer comprises an auxiliary soft layer, an auxiliary trapping layer and an auxiliary protective layer, wherein the auxiliary soft layer covers the trapping layer, and the auxiliary protective layer is located between the auxiliary trapping layer and the auxiliary soft layer.

6. The package of an environmental sensitive electronic element according to claim 1, wherein the material of the trapping layer has an electrical conductivity and a moisture barrier property.

7. The package of an environmental sensitive electronic element according to claim 6, wherein the material of the trapping layer comprises an alkali metal/alkaline-earth metal halide, an alkali metal/alkaline-earth metal oxide, an alkali metal/alkaline-earth metal carbonate, or an alkali metal acetate.

8. The package of an environmental sensitive electronic element according to claim 7, wherein the alkali metal/alkaline-earth metal halide comprises lithium fluoride (LiF), sodium fluoride (NaF), cesium fluoride (CsF), magnesium fluoride (MgF2), calcium fluoride (CaF2), sodium chloride (NaCl), potassium chloride (KCl), rubidium chloride (RbCl), magnesium chloride (MgCl2) or calcium chloride (CaCl2).

9. The package of an environmental sensitive electronic element according to claim 7, wherein the alkali metal/alkaline-earth metal oxide comprises lithium oxide (Li2O), cesium oxide (Cs2O), magnesium oxide (MgO), calcium oxide (CaO), lithium metaborate (LiBO2), or potassium silicon oxide (K2SiO3).

10. The package of an environmental sensitive electronic element according to claim 7, wherein the alkali metal/alkaline-earth metal carbonate comprises lithium carbonate (Li2CO3), sodium carbonate (Na2CO3), or cesium carbonate (Cs2CO3).

11. The package of an environmental sensitive electronic element according to claim 7, wherein the alkali metal acetate comprises lithium acetate (CH3COOLi), sodium acetate (CH3COONa), potassium acetate (CH3COOK), rubidium acetate (CH3COORb), or cesium acetate (CH3COOCs).

12. The package of an environmental sensitive electronic element according to claim 1, wherein the material of the soft layer of the flexible structure layer comprises an organic small molecular material, organic oligomer, a mixture of an oligomer with an inorganic material, and a mixture of organic small molecules with an inorganic material.

13. The package of an environmental sensitive electronic element according to claim 1, wherein the material of the protective layer of the flexible structure layer comprises a metal material or an inorganic material.

14. A package of an environmental sensitive electronic element, comprising:
a first substrate;
a second substrate, configured above the first substrate;
an environmental sensitive electronic element, configured on the first substrate, located between the first substrate and the second substrate, wherein the environmental sensitive electronic element has a first top surface, a first bottom surface opposite to the first top surface and connecting to the first substrate and a first vertical sidewall connecting and perpendicular to the first top surface and the first bottom surface, and the environmental sensitive electronic element comprising:
an anode layer, configured on the first substrate;
a hole injecting layer, configured on the anode layer;
a hole transporting layer, configured on the hole injecting layer;
an organic light emitting layer, configured on the hole transporting layer;
a cathode layer, configured on the organic light emitting layer; and
an electron injection layer, configured between the organic light emitting layer and the cathode layer;
a flexible structure layer, configured on the environmental sensitive electronic element, wherein the flexible structure layer has a second top surface, a second bottom surface opposite to the second top surface and connecting to the first top surface of the environmental sensitive electronic element and a second vertical sidewall connecting and perpendicular to the second top surface and the second bottom surface, and the flexible structure layer comprising:
a soft layer, configured on the cathode layer;
a trapping layer, configured on the soft layer, wherein the material of the trapping layer is the same as the material of the cathode layer; and
a protective layer, configured on the soft layer; and
a filler layer, configured between the first substrate and the second substrate, and at least covering the first vertical sidewall of the environmental sensitive electronic element and the second vertical sidewall and the second top surface of the flexible structure layer, and when the package of the environmental sensitive electronic element is warped, a delaminating occurs to the flexible structure layer.

15. The package of an environmental sensitive electronic element according to claim 14, wherein the trapping layer of the flexible structure layer is located between the protective layer and the soft layer.

16. The package of an environmental sensitive electronic element according to claim 15, further comprising at least one auxiliary flexible structure layer, configured on the flexible structure layer and located between the second substrate and the flexible structure layer, wherein the auxiliary flexible structure layer comprises an auxiliary soft layer, an auxiliary trapping layer and an auxiliary protective layer, wherein the auxiliary soft layer covers the protective layer, and the auxiliary trapping layer is located between the auxiliary protective layer and the auxiliary soft layer.

17. The package of an environmental sensitive electronic element according to claim 14, wherein the protective layer of the flexible structure layer is located between the trapping layer and the soft layer.

18. The package of an environmental sensitive electronic element according to claim 17, further comprising at least one auxiliary flexible structure layer, configured on the flexible structure layer and located between the second substrate and the flexible structure layer, wherein the auxiliary flexible structure layer comprises an auxiliary soft layer, an auxiliary trapping layer and an auxiliary protective layer, wherein the auxiliary soft layer covers the trapping layer, and the auxiliary protective layer is located between the auxiliary trapping layer and the auxiliary soft layer.

19. The package of an environmental sensitive electronic element according to claim 14, wherein the material of the trapping layer has an electrical conductivity and a moisture barrier property.

20. The package of an environmental sensitive electronic element according to claim 19, wherein the material of the trapping layer is selected from the group consisting of silver (Ag), aluminium (Al), magnesium (Mg), lithium (Li), indium (In), calcium (Ca), copper (Cu), molybdenum (Mo), titanium (Ti), platinum (Pt), iridium (Ir), nickel (Ni), chromium (Cr), aurum (Au), and a combination thereof.

21. The package of an environmental sensitive electronic element according to claim 14, wherein the material of the soft layer of the flexible structure layer comprises an organic small molecular material, an organic oligomer, a mixture of an oligomer and an inorganic material, or a mixture of organic small molecules and an inorganic material.

22. The package of an environmental sensitive electronic element according to claim 14, wherein the material of the protective layer of the flexible structure layer comprises a metal material or an inorganic material.

23. A package of an environmental sensitive electronic element, comprising:
a first substrate;
a second substrate, configured above the first substrate;
an environmental sensitive electronic element, configured on the first substrate, located between the first substrate and the second substrate, wherein the environmental sensitive electronic element has a first top surface, a first bottom surface opposite to the first top surface and connecting to the first substrate and a first vertical sidewall connecting and perpendicular to the first top surface and the first bottom surface, and the environmental sensitive electronic element comprising:
an anode layer, configured on the first substrate;
an organic functional layer, configured on the anode layer; and
a cathode layer, configured on the organic functional layer;
a flexible structure layer, configured on the environmental sensitive electronic element, wherein the flexible structure layer has a second top surface, a second bottom surface opposite to the second top surface and connecting to the first top surface of the environmental sensitive electronic element and a second vertical sidewall connecting and perpendicular to the second top surface and the second bottom surface, and the flexible structure layer comprising:
a soft layer, configured on the cathode layer;
a trapping layer, configured on the soft layer, wherein the material of the trapping layer is the same as the material of the organic functional layer or the cathode layer; and
a protective layer, configured on the soft layer; and a filler layer, configured between the first substrate and the second substrate, and at least covering the first vertical sidewall of the environmental sensitive electronic element and the second vertical sidewall and the second top surface of the flexible structure layer, and when the package of the environmental sensitive electronic element is warped, a delaminating occurs to the flexible structure layer.

\* \* \* \* \*